US008912636B2

(12) United States Patent
Goto

(10) Patent No.: US 8,912,636 B2
(45) Date of Patent: Dec. 16, 2014

(54) SEMICONDUCTOR DEVICE

(75) Inventor: Yoshiaki Goto, Nishikasugai-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 756 days.

(21) Appl. No.: 12/699,446

(22) Filed: Feb. 3, 2010

(65) Prior Publication Data

US 2010/0193924 A1    Aug. 5, 2010

(30) Foreign Application Priority Data

Feb. 5, 2009  (JP) ................................. 2009-024988

(51) Int. Cl.
*H01L 23/495* (2006.01)
*H01L 23/00* (2006.01)

(52) U.S. Cl.
CPC ...... *H01L 23/4951* (2013.01); *H01L 23/49513* (2013.01); *H01L 23/49551* (2013.01); *H01L 2224/48091* (2013.01); *H01L 2224/48247* (2013.01); *H01L 24/48* (2013.01)
USPC .................... 257/676; 257/692; 257/E23.031

(58) Field of Classification Search
CPC .................................................. H01L 23/495
USPC ............ 257/666, 669–674, 676, 677, E23.01, 257/E23.043, E23.045–E23.048, E23.051, 257/692
See application file for complete search history.

(56) References Cited

U.S. PATENT DOCUMENTS

| 5,523,617 | A | * | 6/1996 | Asanasavest ................. 257/666 |
| 5,631,193 | A | * | 5/1997 | Burns ............................. 29/827 |
| 6,392,295 | B1 | | 5/2002 | Iwaya et al. |
| 6,545,349 | B2 | | 4/2003 | Iwaya et al. |
| 6,576,994 | B2 | | 6/2003 | Iwaya et al. |
| 6,798,046 | B1 | * | 9/2004 | Miks ............................. 257/666 |
| 7,339,257 | B2 | | 3/2008 | Ozawa et al. |
| 7,375,415 | B2 | * | 5/2008 | Lee et al. ...................... 257/666 |
| 7,612,436 | B1 | * | 11/2009 | Lee et al. ...................... 257/672 |
| 7,728,411 | B2 | * | 6/2010 | Lee et al. ...................... 257/666 |
| 7,919,837 | B2 | | 4/2011 | Ozawa |
| 8,097,495 | B2 | * | 1/2012 | Lee et al. ...................... 438/123 |
| 2002/0014686 | A1 | * | 2/2002 | Kanemoto et al. ............ 257/678 |

(Continued)

FOREIGN PATENT DOCUMENTS

| JP | 2000-196002 | 7/2000 |
| JP | 2005-340766 | 12/2005 |
| JP | 2007-129182 | 5/2007 |
| JP | 2008-85032 | 4/2008 |

OTHER PUBLICATIONS

Japanese Office Action issued Mar. 21, 2012, in Patent Application No. 2009-024988 (with English-language translation).

(Continued)

*Primary Examiner* — Fernando L Toledo
*Assistant Examiner* — Victoria K Hall
(74) *Attorney, Agent, or Firm* — Oblon, Spivak, McClelland, Maier & Neustadt, L.L.P.

(57) ABSTRACT

A lead frame includes an inner lead area overlapping with a chip mounting area, an outer lead portion having outer leads disposed outside the inner lead area, and an inner lead portion having inner leads disposed in the inner lead area. A semiconductor chip is mounted on the chip mounting area of the lead frame. Electrode pads of the semiconductor chip are electrically connected to inner leads via metal wires. Portions of the inner leads located on an area in the inner lead area except the chip mounting area are depressed.

3 Claims, 11 Drawing Sheets

(56) References Cited

U.S. PATENT DOCUMENTS

| | | | |
|---|---|---|---|
| 2004/0053447 A1* | 3/2004 | Foster et al. | 438/123 |
| 2005/0236698 A1* | 10/2005 | Ozawa et al. | 257/666 |
| 2006/0255436 A1* | 11/2006 | Ozawa | 257/666 |
| 2008/0099896 A1* | 5/2008 | Shen et al. | 257/676 |
| 2008/0128877 A1* | 6/2008 | Itoh et al. | 257/676 |
| 2009/0001530 A1* | 1/2009 | Goto | 257/670 |
| 2009/0096073 A1 | 4/2009 | Goto | |
| 2011/0133323 A1 | 6/2011 | Ozawa | |

OTHER PUBLICATIONS

Decision of Final Rejection issued Jan. 8, 2013 in Japanese patent Application No. 2009-024988 (with English translation).

* cited by examiner

FIG. 7
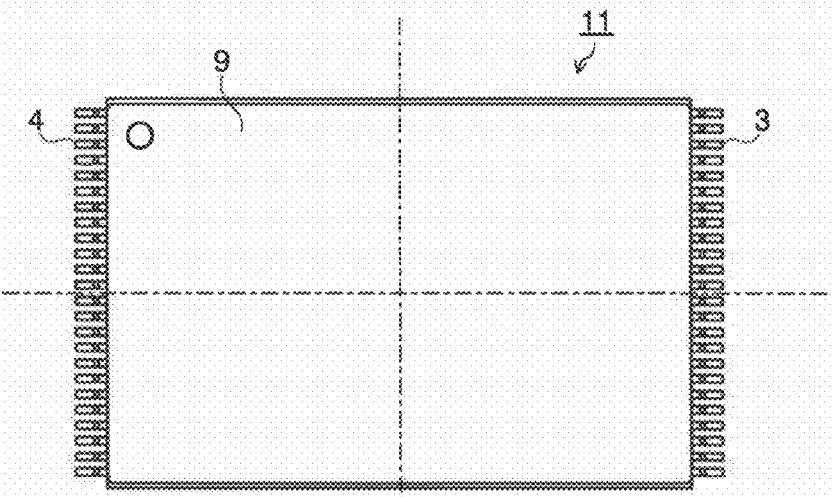
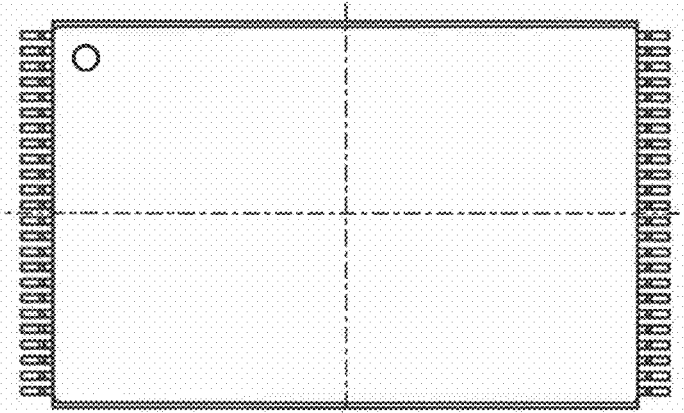
FIG. 8
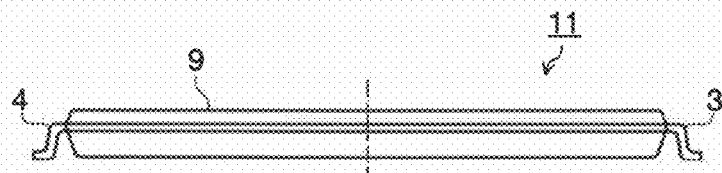

SEMICONDUCTOR DEVICE

CROSS-REFERENCE TO RELATED APPLICATIONS

This application is based upon and claims the benefit of priority from the prior Japanese Patent Application No. 2009-024988 filed on Feb. 5, 2009; the entire contents of which are incorporated herein by reference.

BACKGROUND OF THE INVENTION

Various pad arrangements are adopted in semiconductor chips. For example, there has been known a pad structure in which electrode pads are concentrated along one side of a semiconductor chip (hereinafter, referred as a single-side pad structure). In a semiconductor chip having the single-side pad structure, a chip size can be small, and in addition, a connection area for connection with a circuit base such as a lead frame is set at one place. Therefore, when a plurality of semiconductor chips are stacked stepwise, wire bondability can be maintained. Wire bonding of the electrode pads of such semiconductor chips and inner leads of the lead frame is performed only in an area along one side of each of the semiconductor chips. Therefore, a lead frame on which part of inner leads are routed inside a semiconductor chip mounting area (see JP-A2005-340766 (KOKAI), JP-A 2008-085032 (KOKAI)) is used.

As a chip mounting structure, a structure in which the semiconductor chips are mounted on upper sides of the inner leads routed in the semiconductor chip mounting area (Chip on Lead (COL) structure) is used. The semiconductor chip mounting area on the lead frame is set so as to overlap with an area where the inner leads are disposed. The inner leads routed in the chip mounting area are generally formed in a shape corresponding to the outline of the semiconductor chips mounted on this portion. A resin molding part sealing the semiconductor chips has a shape close to the outline of the semiconductor chips. In other words, the area of the semiconductor chips occupying the resin molding part becomes large.

In the semiconductor chip having the single-side pad structure, it is possible to connect the electrode pads of the semiconductor chip and the inner leads by bonding wires even when the semiconductor chip is smaller than the shape of the inner leads routed in the chip mounting area. If the sizes of the lead frame and the package are made small according to the chip size, a mold and a jig used in a manufacturing process has to be prepared individually. A semiconductor package in which a semiconductor chip smaller than the shape of the inner leads is mounted is in need. In this case, however, the shape of the resin molding part becomes larger than the outline of the semiconductor chip and the area of the semiconductor chip occupying the resin molding part becomes small.

Molding process of resin-sealing a semiconductor chip mounted on a lead frame is generally performed under high temperature of about 180° C. Therefore, in a cooling process to room temperature after the molding, there sometimes occurs warpage in the resin sealing part due to a difference in coefficient of thermal expansion among materials. Since the coefficient of thermal expansion of molding resin is larger than those of the lead frame and the semiconductor chip, a shrinkage amount at the time of cooling from the high temperature of about 180° C. to room temperature is larger in the molding resin. A difference in resin thickness between an upper side and a lower side of the lead frame and the semiconductor chip, if any, results in a larger shrinkage amount of the side with the larger resin thickness than a shrinkage amount of the side with the smaller resin thickness, which causes warpage of the package so that the side with the larger resin thickness is concave.

In a semiconductor package using a lead frame on which some of inner leads are routed in a chip mounting area, when the shape of the inner leads is made to correspond to the outline of a semiconductor chip, an area where the resin thickness differs between an upper side and a lower side of the lead frame (area where the semiconductor chip is not mounted) is small. Therefore, the warpage of the resin sealing part is not very significant. On the other hand, when a semiconductor chip smaller than the shape of inner leads is mounted, an area where resin thickness differs between an upper side and a lower side of a lead frame is large, and thus warpage is likely to occur in a resin sealing part and a warpage amount is also large. Under such circumferences, there has been a demand for preventing the warpage of the resin sealing part.

BRIEF SUMMARY OF THE INVENTION

A semiconductor device according to a first mode of the present invention includes: a circuit base including a chip mounting area, an inner lead area provided so as to at least partly overlap with the chip mounting area, an outer lead portion having a plurality of outer leads disposed outside the inner lead area, and an inner lead portion having a plurality of inner leads disposed inside the inner lead area; a semiconductor chip, mounted on the chip mounting area of the circuit base, having electrode pads arranged along one outline side; metal wires electrically connecting the electrode pads of the semiconductor chip and the inner leads of the circuit base; and a resin sealing part sealing the semiconductor chip together with the metal wires, wherein portions of the inner leads located on an area in the inner lead area except the chip mounting area are depressed.

A semiconductor device according to a second mode of the present invention includes: a circuit base having a chip mounting area, a first outer lead portion having first outer leads, a second outer lead portion having second outer leads opposed to the first outer leads via the chip mounting area, and an inner lead portion having first inner leads connected to the first outer leads and second inner leads connected to the second outer leads, wherein at least either of the first inner leads and the second inner leads are routed inside the chip mounting area; a semiconductor chip, mounted on the chip mounting area of the circuit base, having electrode pads arranged along at least one outline side; metal wires electrically connecting the electrode pads of the semiconductor chip and the first and second inner leads of the circuit base; a fixing member collectively fixing the first inner leads and the second inner leads; and a resin sealing part sealing the semiconductor chip together with the metal wires.

BRIEF DESCRIPTION OF THE DRAWINGS

FIG. 7 is a plane view showing the semiconductor devices according to the first embodiment.

FIG. 8 is a side view of the semiconductor device shown in FIG. 7.

DETAILED DESCRIPTION OF THE INVENTION

Figure 1:
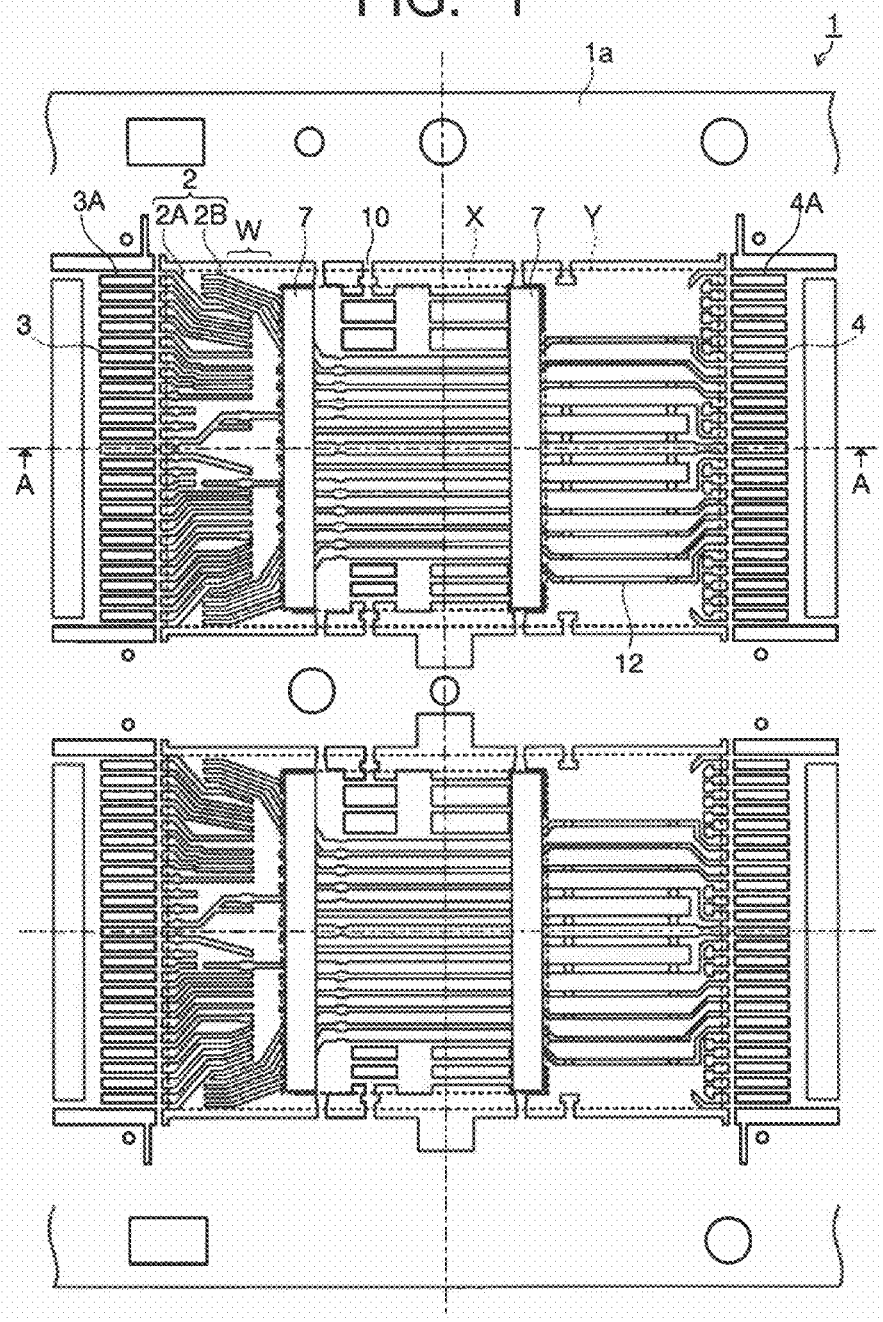
FIG. 1 is a plane view showing a lead frame used for a semiconductor device of a first embodiment.
Figure 2:
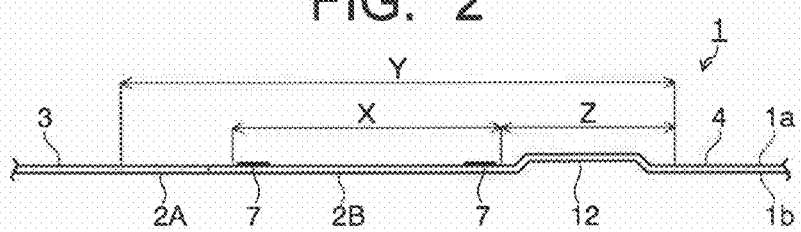
FIG. 2 is a cross-sectional view taken along A-A line in FIG. 1.
Figure 3:
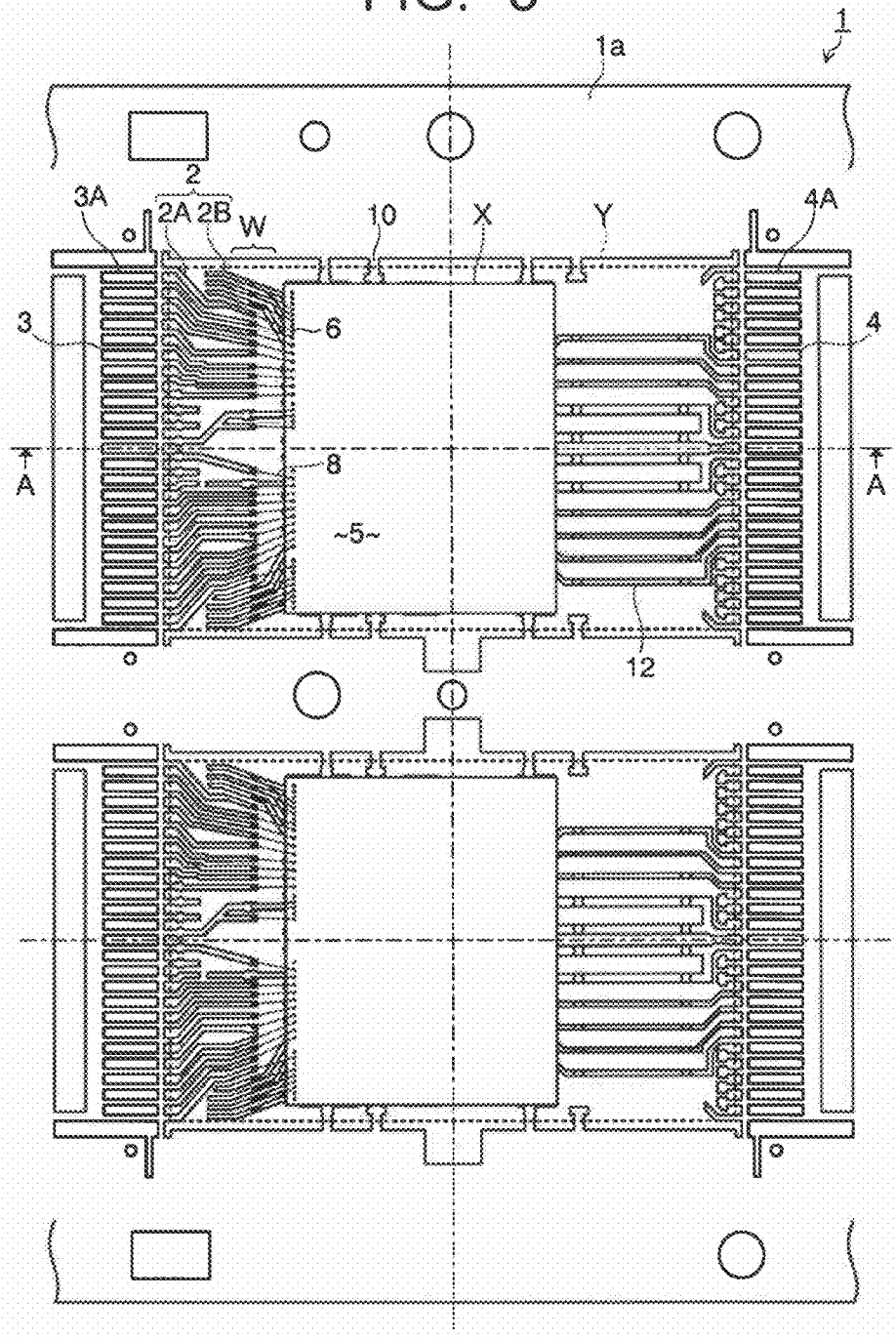
FIG. 3 is a plane view showing a state where semiconductor chips are mounted on the lead frame shown in FIG. 1.
Figure 4:
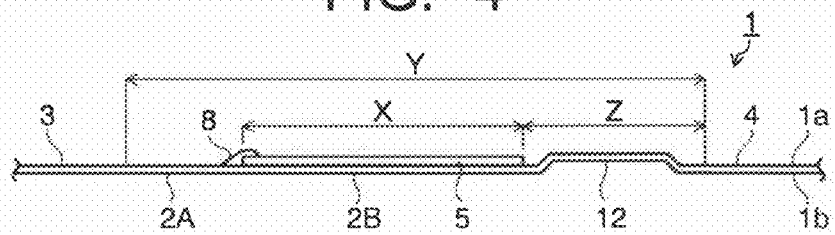
FIG. 4 is a cross-sectional view taken along A-A line in FIG. 3.
Figure 5:
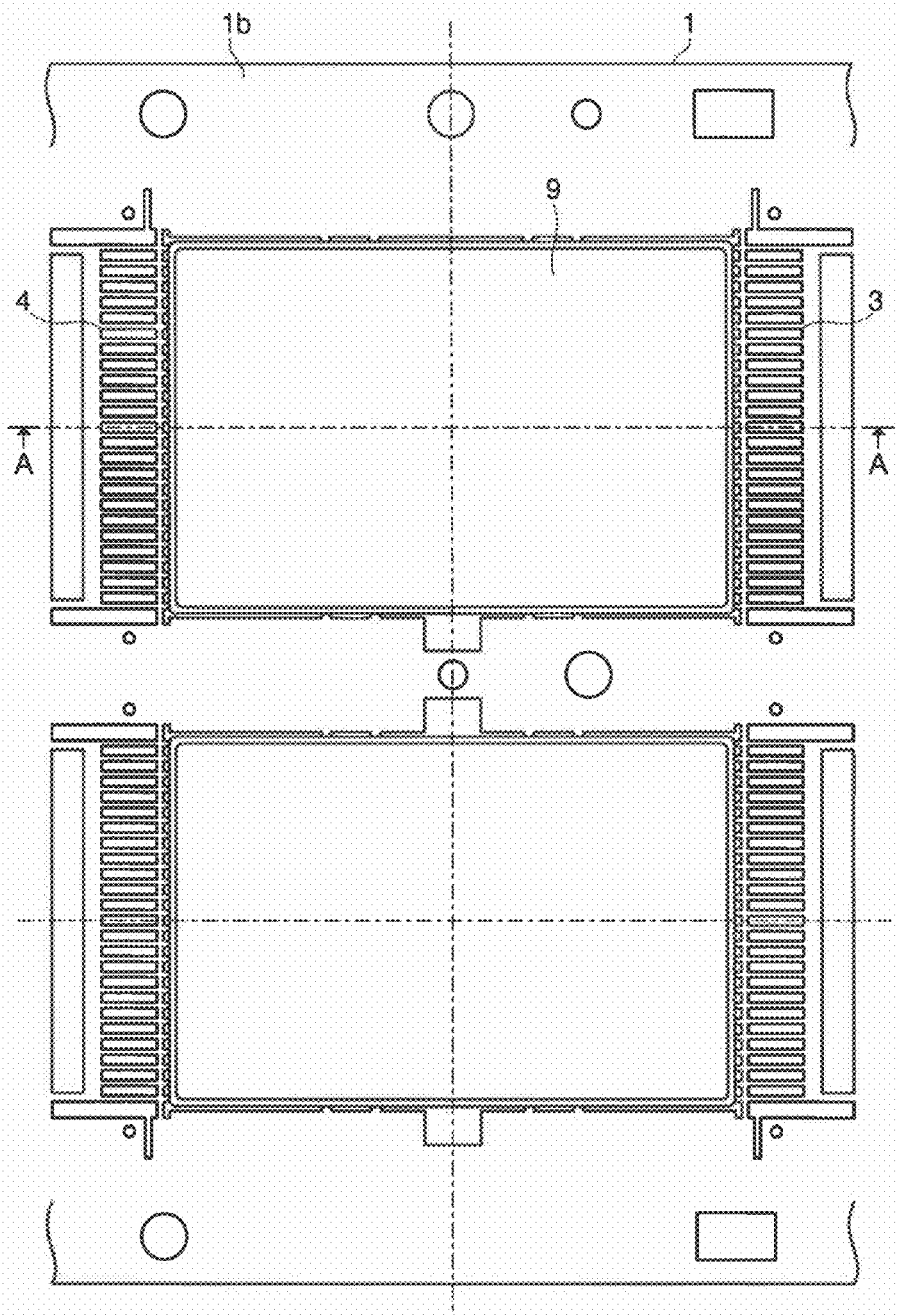
FIG. 5 is a plane view showing a state where the semiconductor chips mounted on the lead frame are resin-sealed.
Figure 6:
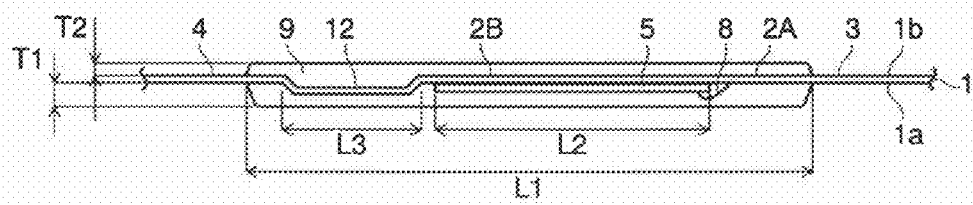
FIG. 6 is a cross-sectional view taken along A-A line in FIG. 5.

Hereinafter, embodiments for carrying out the present invention will be described. A semiconductor device of a first embodiment and its manufacturing processes will be described with reference to FIG. 1 to FIG. 8. FIG. 1 and FIG. 2 show a lead frame used for the semiconductor device of the first embodiment. FIG. 3 and FIG. 4 show a state where semiconductor chips are mounted on the lead frame shown in FIG. 1 and FIG. 2. FIG. 5 and FIG. 6 show a state where the semiconductor chips are resin-sealed. FIG. 7 and FIG. 8 show a state where the semiconductor devices are separated from the lead frame.

The semiconductor device of the first embodiment has a COL structure in which the semiconductor chip is mounted on the lead frame (structure in which a grinding surface (surfaces opposite a circuit surface) of the semiconductor chip is bonded on the lead frame). FIG. 1 to FIG. 4 show a state where the semiconductor chips are mounted on an upper side of the lead frame. FIG. 6 shows a state where the semiconductor chip is located under the lead frame since the lead frame is turned upside down when the semiconductor chips are resin-sealed. In FIG. 5, FIG. 7 and FIG. 8, the illustration of the semiconductor chips is omitted, but a mounting state of the semiconductor chips is the same as that in FIG. 6.

The lead frame 1 shown in FIG. 1 and FIG. 2 includes an inner lead portion 2 serving as a portion for connection with the semiconductor chip mounted thereon and first and second outer lead portions 3, 4 serving as external connection terminals. The first outer lead portion 3 has a plurality of outer leads (first outer leads) 3A. The second outer lead portion 4 has a plurality of outer leads (second outer leads) 4A. The inner lead portion 2 has first inner leads 2A connected to the first outer leads 3A and second inner leads 2B connected to the second outer leads 4A.

The lead frame 1 has a first surface 1a on which the semiconductor chip is mounted and a second surface 1b located on an upper side when the semiconductor device is formed. On the first surface 1a of the lead frame 1, a semiconductor chip 5 having a single-side pad structure is mounted as shown in FIG. 3 and FIG. 4. The lead frame 1 has a chip mounting area X corresponding to a portion on which the semiconductor chip 5 is mounted. The lead frame 1 has an inner lead area Y where the first and second inner leads 2A, 2B are disposed. The chip mounting area X is located on an inner side of the inner lead area Y. Since the semiconductor chip 5 has the single-side pad structure, the chip mounting area X at least partly overlaps with the inner lead area Y.

The first outer lead portion 3 is disposed along one shorter side of the inner lead area Y. The second outer lead portion 4 is disposed along the other shorter side of the inner lead area Y. The first outer lead portion 3 and the second outer lead portion 4 face each other across the chip mounting area X and the inner lead area Y. The first and second outer lead portions 3, 4 are disposed so that the outer leads 3A, 4A protrude from both shorter sides of a resin sealed body of the semiconductor device (TSOP or the like) formed by using the lead frame 1.

A connection area W for connection with the semiconductor chip 5 by the inner lead portion 2 is set along one side of the chip mounting area X since the semiconductor chip 5 has the single-side pad structure. FIG. 1 shows the lead frame 1 in which the connection area W for connection with the semiconductor chip 5 by the inner lead portion 2 is set on a first outer lead portion 3 side. The first inner leads 2A are disposed on the first outer lead portion 3 side, and therefore, while one-side ends thereof are connected to the first outer leads 3A, the other ends (leading ends) thereof can be disposed in the connection area W for connection with the semiconductor chip 5.

In the second inner leads 2B, while one-side ends are connected to the second outer leads 4A, the other ends (leading ends) need to be disposed in the connection area W on the first outer lead portion 3 side facing the second outer lead portion 4 across the chip mounting area X. For this purpose, the second inner leads 2B extend from the one-side ends connected to the second outer leads 4A to the other ends (leading ends) disposed in the connection area W set on the first outer lead portion 3 side. The second inner leads 2B are routed from the second outer lead portion 4 toward the first outer lead portion 3 via the chip mounting area X.

On the first surface 1a of the lead frame 1, the semiconductor chip 5 having the single-side pad structure is mounted. The semiconductor chip 5 has a rectangular outline and electrode pads 6 arranged along one outline side. In order to enable wire bonding between the electrode pads 6 of the semiconductor chip 5 and the inner lead portion 2 (concretely, the leading ends of the first and second inner leads 2A, 2B), the semiconductor chip 5 is disposed so that the outline side which the electrode pads 6 are arranged (pad arranged side) is located near the connection area W.

Concrete examples of the semiconductor chip 5 include a semiconductor memory chip (memory device) such as a NAND flash memory. Though FIG. 3 and FIG. 4 show a state where the single semiconductor chip 5 is mounted on the lead frame 1, a plurality of semiconductor chips may be stacked and mounted on the lead frame 1. In this case, stacking the semiconductor chips having the single-side pad structure stepwise enables good wire bonding for each of the semiconductor chips. The number of the stacked semiconductor chips 5 is not particularly limited. The semiconductor chip 5 is not limited to the semiconductor memory chip. A stack of the semiconductor chips may have a semiconductor memory chip and its controller chip.

The semiconductor chip 5 is bonded on the first surface 1a of the lead frame 1, with its surface (circuit surface) on which the electrode pads 6 are formed facing upward. The lead frame 1 has adhesive tapes 7 for bonding the semiconductor chip 5. The semiconductor chip 5 is bonded on the lead frame 1 via the adhesive tapes 7. The adhesive tapes 7 are affixed on a bonding surface (surface to which metal wires are connected) of the second inner leads 2B. The semiconductor chip 5 is bonded on the second inner leads 2B via the adhesive tapes 7. For the adhesive tapes 7, die-attach films whose main component is polyimide resin or the like are used.

The adhesive tapes 7 have a function of not only bonding the semiconductor chip 5 but also holding the second inner leads 2B. The adhesive tapes 7 each have a first adhesive layer bonded on the second inner leads 2B and a second adhesive layer opposite the first adhesive layer. The first adhesive layers of the adhesive tapes 7 are bonded on the bonding surfaces of the second inner leads 2B. The second inner leads 2B are held by the adhesive tapes 7. This reduces the deformation of the second inner leads 2B and the deterioration of handling. Further, wire bondability to the second inner leads 2B is also improved. The semiconductor chip 5 is bonded on the second adhesive layers of the adhesive tapes 7.

The electrode pads 6 of the semiconductor chip 5 are electrically connected to the leading ends of the first and second inner leads 2A, 2B of the inner lead portion 2 via the metal wires 8 as shown in FIG. 3 and FIG. 4. Some of the electrode pads 6 are electrically connected to the leading ends of the first inner leads 2A, extending from the first outer leads 3A. Some of the electrode pads 6 are electrically connected to the leading ends of the second inner leads 2B which are routed from the second outer leads 4A to the connection area W via the chip mounting area X.

The semiconductor chip 5 mounted on the first surface 1a of the lead frame 1 is sealed by a resin sealing part 9 formed by molding as shown in FIG. 5 and FIG. 6. The semiconductor chip 5 mounted on the lead frame 1 is sealed by the resin sealing part 9 integrally with the inner lead portion 2 and the metal wires 8. For the resin sealing part 9, common epoxy resin is used. The resin sealing part 9 is provided so as to cover the first and second surfaces 1a, 1b of the lead frame 1.

Since the semiconductor chip 5 is mounted on the first surface 1a of the lead frame 1, the resin sealing part 9 is formed so that the semiconductor chip 5 is located near the center in terms of its thickness direction. In such a resin sealing part 9 except an area including the semiconductor chip 5, a thickness of a first surface 1a side (first resin thickness T1) is larger than a thickness of a second surface 1b side (second resin thickness T2). The first and second resin thicknesses T1, T2 are thicknesses from reference positions corresponding to upper and lower surfaces of the outer lead portions 3, 4 protruding from the resin sealing part 9.

As shown in FIG. 7 and FIG. 8, the first and second outer lead portions 3, 4 and suspension pins 10 are separated from the lead frame 1 and the first and second outer leads 3A, 4A are worked into a gull-wing shape, whereby a semiconductor device 11 using the lead frame 1 is formed. In the semiconductor device 11, the finally cut lead frame 1 forms a circuit base (lead member). The circuit base includes the inner lead portion 2, the outer lead portions 3, 4, the chip mounting area X, and the inner lead area Y.

The lead frame 1 of the first embodiment has a shape corresponding to a large semiconductor chip (a semiconductor chip larger in outline shape than the semiconductor chip 5 mounted in this embodiment (hereinafter, referred to as a large chip)). Specifically, in the lead frame 1, the second inner leads 2B serving as semiconductor chip mounting portions have a shape corresponding to the large chip. In the first embodiment, the semiconductor chip 5, whose pad arranged side is equal in length to that of the large chip and whose outline side perpendicular to the pad arranged side is shorter than that of the large chip, is mounted on the second inner leads 2B.

Since the semiconductor chip 5 is disposed so that the pad arranged side is located near the connection area W, the chip mounting area X is set at a position biased toward the first outer lead portion 3 side in the inner lead area Y. The area of the chip mounting area X occupying the inner lead area Y is small. An area in the inner lead area Y except the chip mounting area X, concretely, an area Z between the second outer lead portion 4 and the chip mounting area X is large. Therefore, in the second inner leads 2B, portions located in the area Z excluding the chip mounting area X are long.

If the lead frame having such inner leads is resin-molded as it is, an area where an upper side and a lower side of the lead frame differ in resin thickness becomes large. If the area where the upper side and the lower side of the lead frame differ in resin thickness becomes large, a shrinkage amount of the side with the larger resin thickness becomes larger than that of the side with the smaller resin thickness during a cooling process after the molding, due to a difference between a coefficient of thermal expansion of the molding resin and those of the lead frame and the semiconductor chip, which causes such warpage that the side with the larger resin thickness becomes in a concave shape.

In the semiconductor device 11 shown in FIG. 8, the resin sealing part 9 warps so as to bulge upward. The occurrence of such warpage involves a risk that the total height of the semiconductor package (height from bottom surfaces of leading ends of the outer leads to the highest portion of the resin sealing part) is not up to standard. Adjusting the shape of the outer leads in order to reduce the total height of the semiconductor package results in small standoff height (height from the bottom surfaces of the leading ends of the outer leads to the lowest portion of the resin sealing part) on the contrary, which involves a risk that the standoff height is not up to standard.

Therefore, in the semiconductor device 11 of this embodiment, portions, of the second inner leads 2B, located in the area in the inner lead area Y except the chip mounting area X are depressed as shown in FIG. 1 to FIG. 4. Concretely, in the second inner leads 2B, portions located in the area Z between the portions connected to the second outer lead portion 4 and the chip mounting area X are worked into a depression. The second inner leads 2B have worked portions 12 formed in a manner that the portions located in the area Z are worked into the depression.

Since the second inner leads 2B extend from the second outer lead portion 4 to the leading ends located in the connection area W, only middle portions of the second inner leads 2B in the area Z are worked into the depression. Common depression work is that in four directions, but in this embodiment, the depression work is that only in two directions. In the semiconductor device 11 of this embodiment, only the second inner leads 2B, concretely only the portions, of the second inner leads 2B, located in the area Z are worked into the depression.

The second inner leads 2B are worked into the depression so as to bulge downward (bulge upward in FIG. 2 and FIG. 4) so that the aforesaid area where the resin thickness T1 is larger than the resin thickness T2 is reduced. The worked portions 12 are formed so that the resin thickness T1 and the resin thickness T2 of the area corresponding to the portions, of the second inner leads 2B, located in the area Z become substantially equal to each other.

Further, the resin thickness T1 is larger than the resin thickness T2 also in an area corresponding to the portions, of the second inner leads 2B, between the worked portions 12 and the second outer lead portion 4, in an area corresponding to the first inner leads 2A, and in the connection area W, and these areas may possibly influence warpage. In such a case, it is preferable to work the portions into a deeper depression so as to compensate for the difference in resin thickness in these areas. Specifically, in order to compensate also for the difference in resin thickness of the areas other than the portions, of the second inner leads 2B located in the area Z, the portions are preferably worked into a depression so that the resin thickness T2 of the area where the worked portions 12 are located becomes larger.

As described above, the second inner leads 2B have the worked portions 12 which are formed in a manner that the portions located in the area Z in the inner lead area Y except the chip mounting area X are worked into a depression. Therefore, even when the chip mounting area X is small relative to the second inner leads 2B and an area between the chip mounting area X and the second outer lead portion 4 is wide, the area where a difference in resin thickness between the upper side and the lower side of the lead frame 2 is large (area where the resin thickness T1 and the resin thickness T2 are different) is reduced. Therefore, it is possible to suppress the warpage of the resin sealing part 9 ascribable to the area where the difference in resin thickness is large. This makes it possible to provide the semiconductor device 11 with a small warpage amount.

Further, since the worked portions 12 are formed in the middle portions of the second inner leads 2B, the depression work can be that in two directions, while the conventional depression work is that in four directions. In the depression work in two directions, the work itself is easier than the work in four directions, and positions of the leading ends of the inner leads 2B are prevented from being misaligned due to the depression work. In addition, the leading ends of the second inner leads 2B can easily have the same height as the height of the leading ends of the first inner leads 2A. This can improve wire bondability to the inner leads 2A, 2B. That is, it is possible to provide the semiconductor device 11 with a small warpage amount and with excellent connection reliability.

Figure 9:
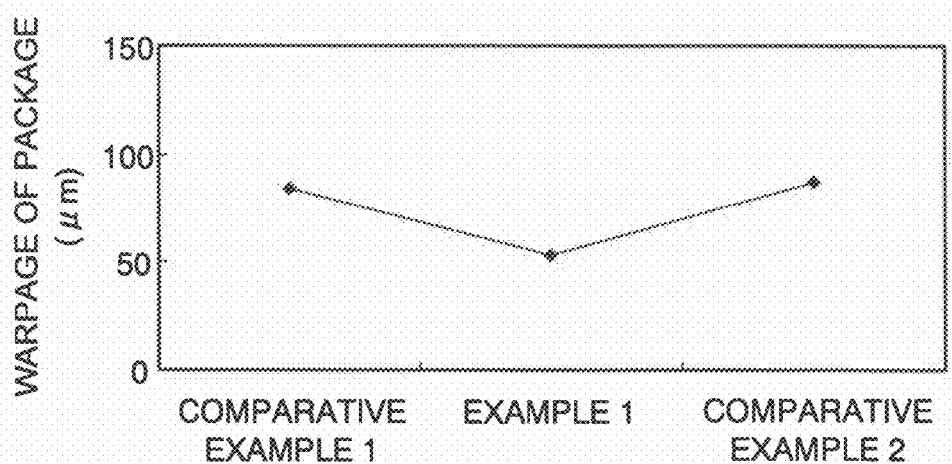
FIG. 9 is a chart showing measurement results of a warpage amount of a semiconductor device according to an example 1 (TSOP), in comparison with those of a conventional semiconductor device.
Figure 10:
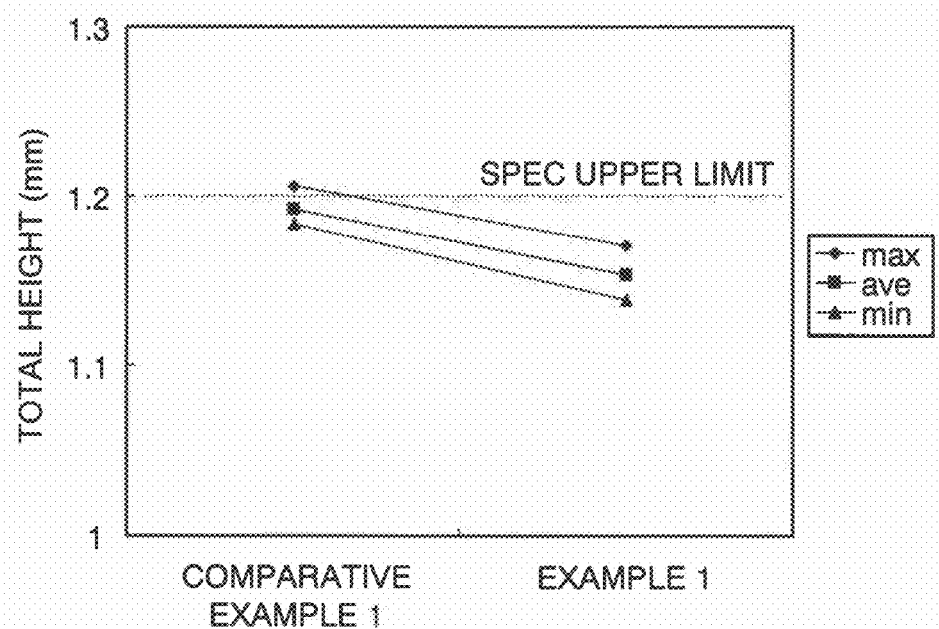
FIG. 10 is a chart showing measurement results of total height of the semiconductor device according to the example 1 (TSOP), in comparison with those of the conventional semiconductor device.
Figure 11:
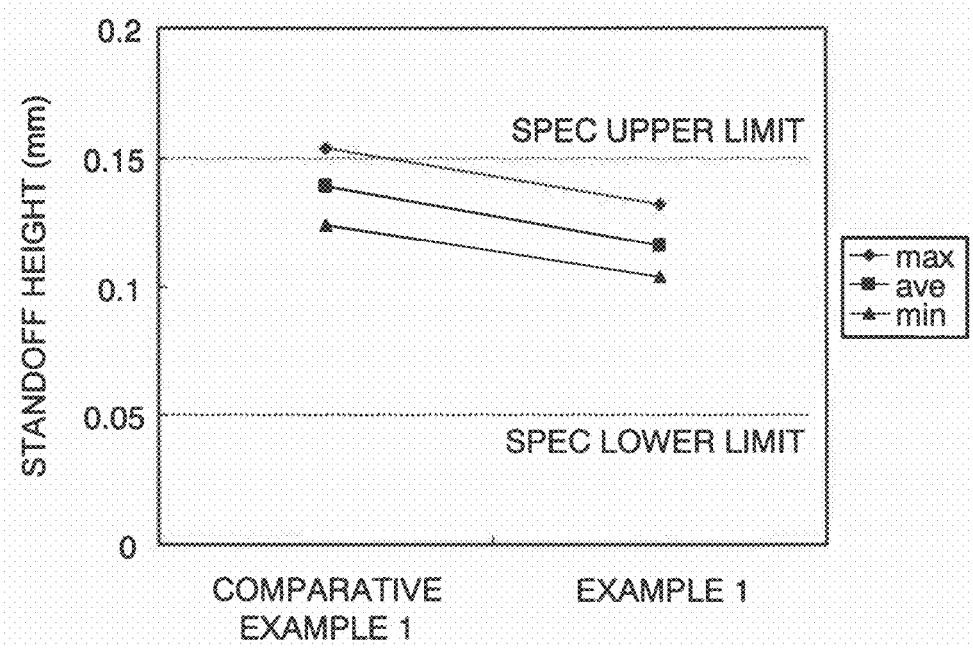
FIG. 11 is a chart showing measurement results of standoff height of the semiconductor device according to the example 1 (TSOP), in comparison with those of the conventional semiconductor device.

FIG. 9, FIG. 10, and FIG. 11 show measurement results of a warpage amount, total height, and standoff height of a semiconductor device (TSOP) according to an example 1, in comparison with measurement results of a conventional semiconductor device (TSOP). FIG. 9 shows the warpage amount of the TSOP, FIG. 10 shows the total height of the TSOP, and FIG. 11 shows the standoff height of the TSOP. The warpage amounts shown in FIG. 9 are values obtained when flatness of the resin sealing part 9 of the package is measured. The total height and the standoff height are as described previously.

In FIG. 9, FIG. 10, and FIG. 11, the example 1 is a semiconductor package based on the first embodiment, and is a case where a total width of the resin sealing part 9 (L1 in FIG. 6) is 18.4 mm, a width of the semiconductor chip 5 (L2 in FIG. 6) is 8.2 mm, and a width of the worked portions 12 (L3 in FIG. 6) is 5.1 mm. A comparative example 1 is a semiconductor package using the same lead frame as that of the example 1 except in that the depression work is not applied. A comparative example 2 is a semiconductor package in which the lead frame of the example 1 is worked in four directions into a depression.

As is apparent from FIG. 9, FIG. 10, and FIG. 11, it is seen that, in the semiconductor package (semiconductor device 11) according to the example 1, the warpage amount is small and accordingly the total height is also smaller than that of the comparative example 1. The standoff height also has a proper value. As is apparent from these measurement results, according to the first embodiment, it is possible to provide the semiconductor device 11 with a small warpage amount and with excellent shape reliability and connection reliability. Since in the semiconductor device 11 of the first embodiment, the lead frame 1 for large chip is applied to the small semiconductor chip 5, semiconductor packages (semiconductor devices) on which semiconductor chips in various shapes are mounted can be provided with one package shape. This contributes to reduction in manufacturing cost of the semiconductor package.

Figure 16:
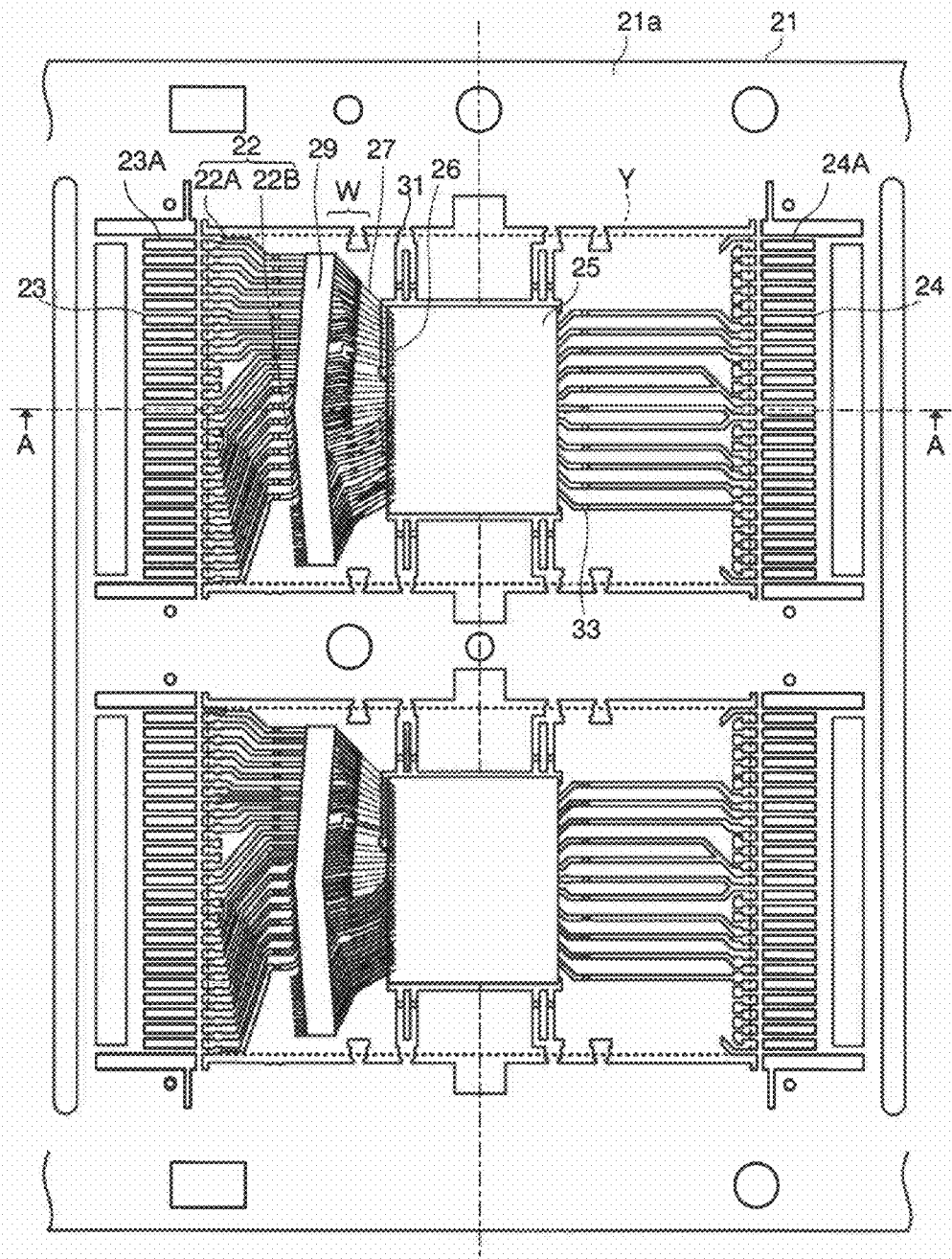
FIG. 16 is a plane view showing a state where semiconductor chips are mounted on the lead frame shown in FIG. 14.
Figure 17:
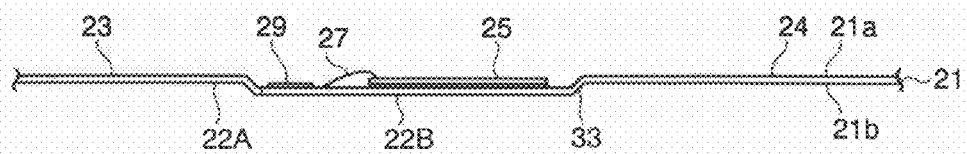
FIG. 17 is a cross-sectional view taken along A-A line in FIG. 16.
Figure 18:
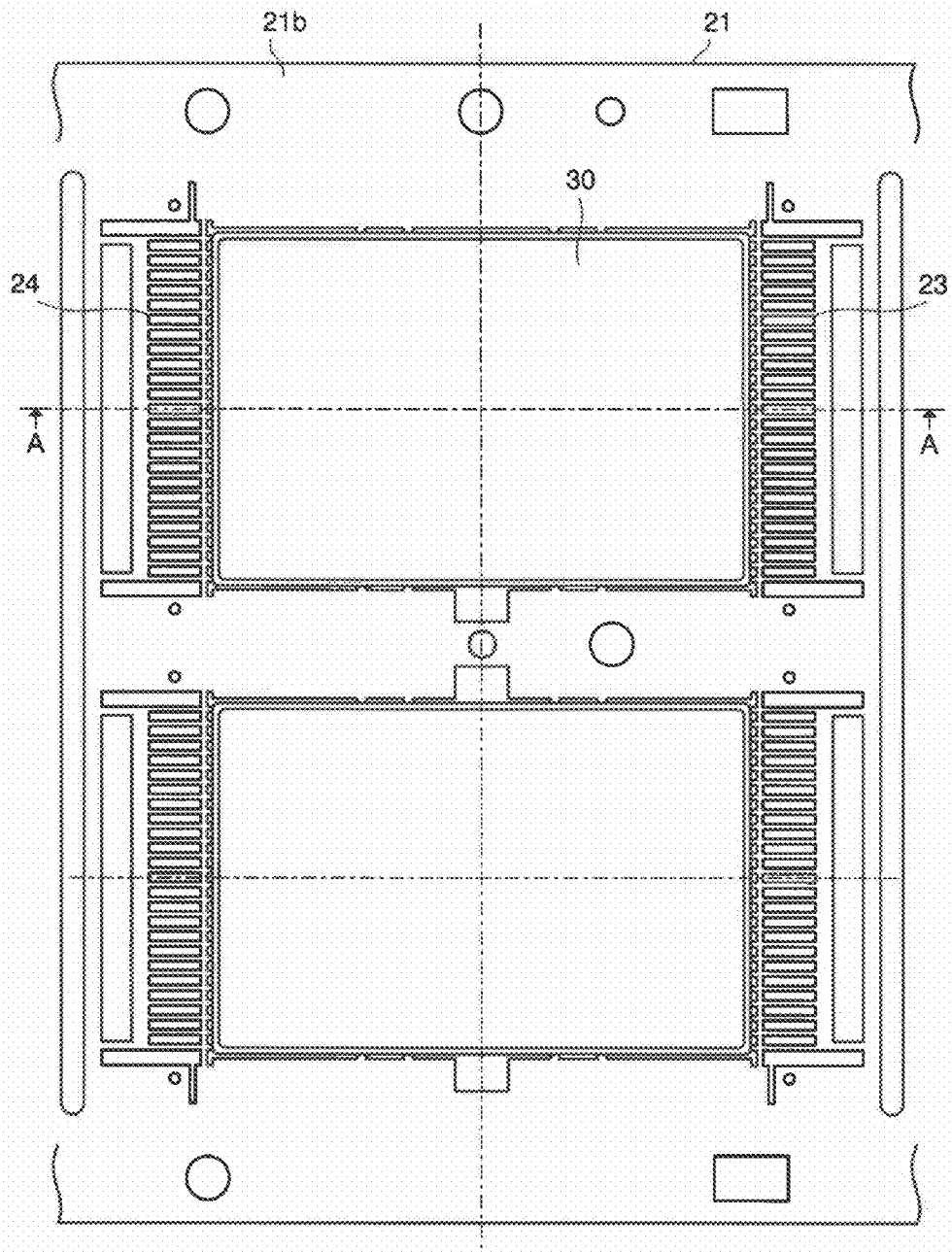
FIG. 18 is a plane view showing a state where the semiconductor chips mounted on the lead frame are resin-sealed.
Figure 19:
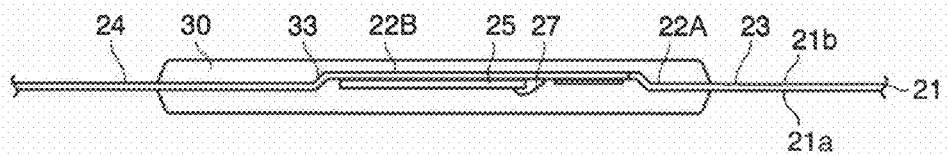
FIG. 19 is a cross-sectional view taken along A-A line in FIG. 18.
Figure 20:
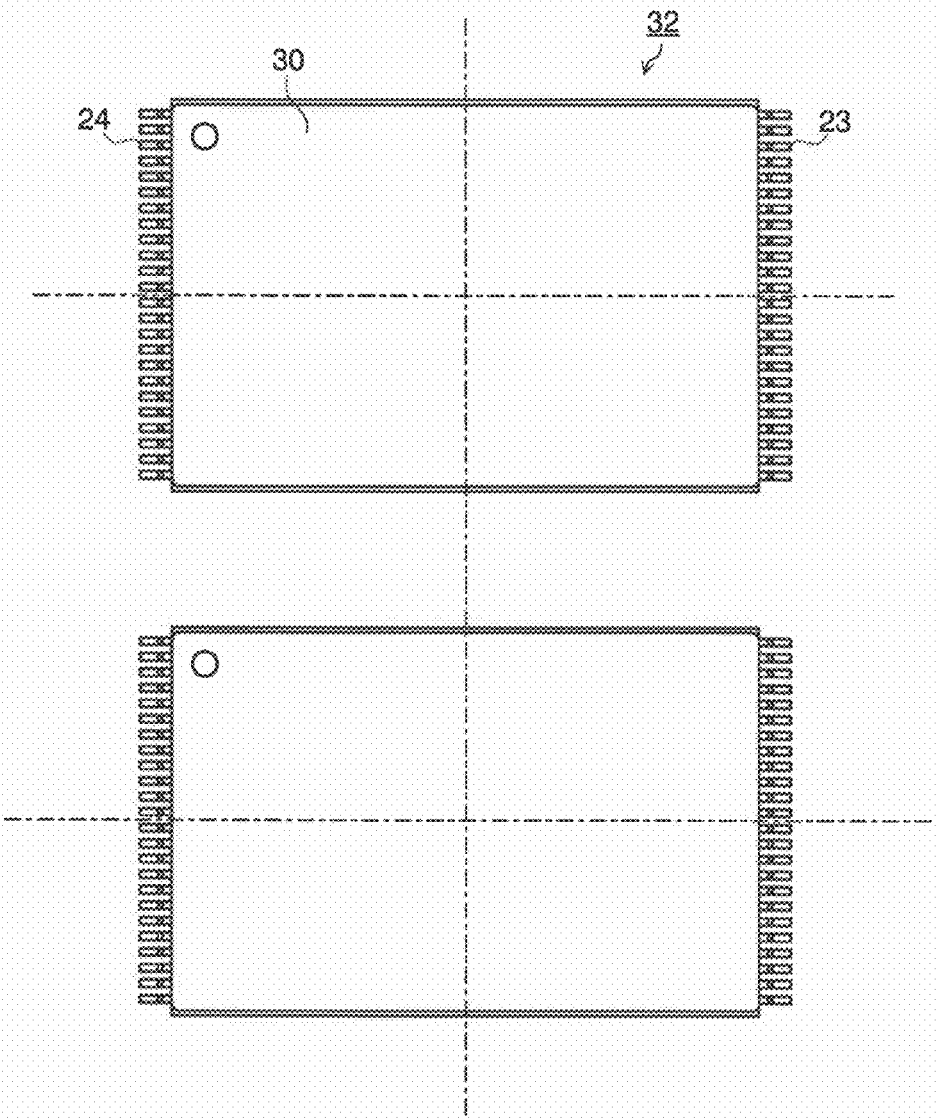
FIG. 20 is a plane view showing the semiconductor devices according to the second embodiment.
Figure 21:
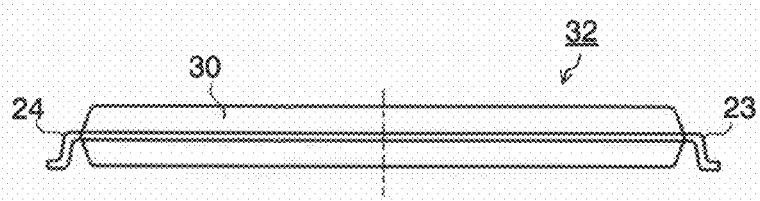
FIG. 21 is a side view of the semiconductor device shown in FIG. 20.

Next, a semiconductor device according to a second embodiment and its manufacturing processes will be described with reference to FIG. 12 to FIG. 21. FIG. 12 to FIG. 15 show a lead frame used for the semiconductor device of the second embodiment. FIG. 16 and FIG. 17 show a state where semiconductor chips are mounted on the lead frame shown in FIG. 12 to FIG. 15. FIG. 18 and FIG. 19 show a state where the semiconductor chips are resin-sealed. FIG. 20 and FIG. 21 show a state where the semiconductor devices are separated from the lead frame.

The semiconductor device of the second embodiment has a COL structure in which the semiconductor chip is mounted on the lead frame (structure in which a polished surface (surface opposite a circuit surface of the semiconductor chip) is bonded on the lead frame). FIG. 12 to FIG. 17 show a state where the semiconductor chips are mounted on an upper side of the lead frame. However, FIG. 19 shows a state where the semiconductor chip is located under the lead frame since the lead frame is turned upside down when the semiconductor chips mounted on the lead frame are resin-sealed. In FIG. 18, FIG. 20, and FIG. 21, the illustration of the semiconductor chips is omitted, but a mounting state of the semiconductor chips is the same as that in FIG. 19.

The lead frame 21 shown in FIG. 12 to FIG. 15 includes an inner lead portion 22 serving as a portion for connection with the semiconductor chip mounted thereon and first and second outer lead portions 23, 24 serving as external connection terminals. The first outer lead portion 23 has a plurality of outer leads (first outer leads) 23A. The second outer lead portion 24 has a plurality of outer leads (second outer leads) 24A. The inner lead portion 22 has first inner leads 22A connected to the first outer leads 23A and second inner leads 22B connected to the second outer leads 24A.

The lead frame 21 has a first surface 21a on which the semiconductor chip is mounted and a second surface 21b located on an upper side when the semiconductor device is formed. On the first surface 21a of the lead frame 21, a semiconductor chip 25 having a single-side pad structure is mounted as shown in FIG. 16 and FIG. 17. The lead frame 21 has a chip mounting area X corresponding to a portion on which the semiconductor chip 25 is mounted. The lead frame 21 has an inner lead area Y where the inner leads 22A, 22B are disposed. The chip mounting area X is located on an inner side of the inner lead area Y. Since the semiconductor chip 25 has the single-side pad structure, the chip mounting area X at least partly overlaps with the inner lead area Y.

The first outer lead portion 23 is disposed along one shorter side of the inner lead area Y. The second outer lead portion 24 is disposed along the other shorter side of the inner lead area Y. The first outer lead portion 23 and the second outer lead portion 24 face each other across the chip mounting area X. The first and second outer lead portions 23, 24 are disposed so that the outer leads 23A, 24A protrude from both shorter sides of a resin sealed body of the semiconductor device (TSOP or the like) formed by using the lead frame 21.

Figure 12:
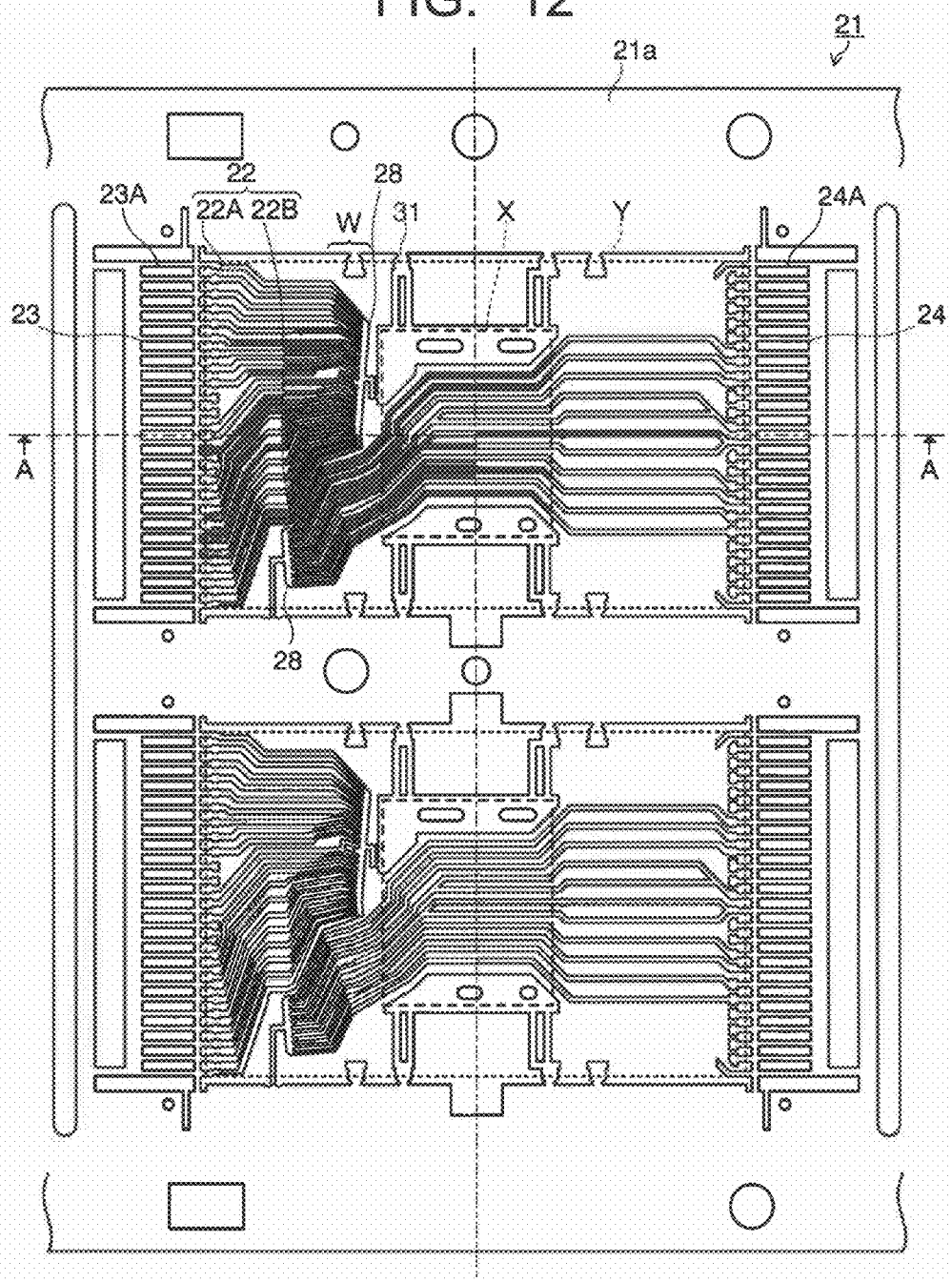
FIG. 12 is a plane view showing a lead frame used for a semiconductor device of a second embodiment.
Figure 14:
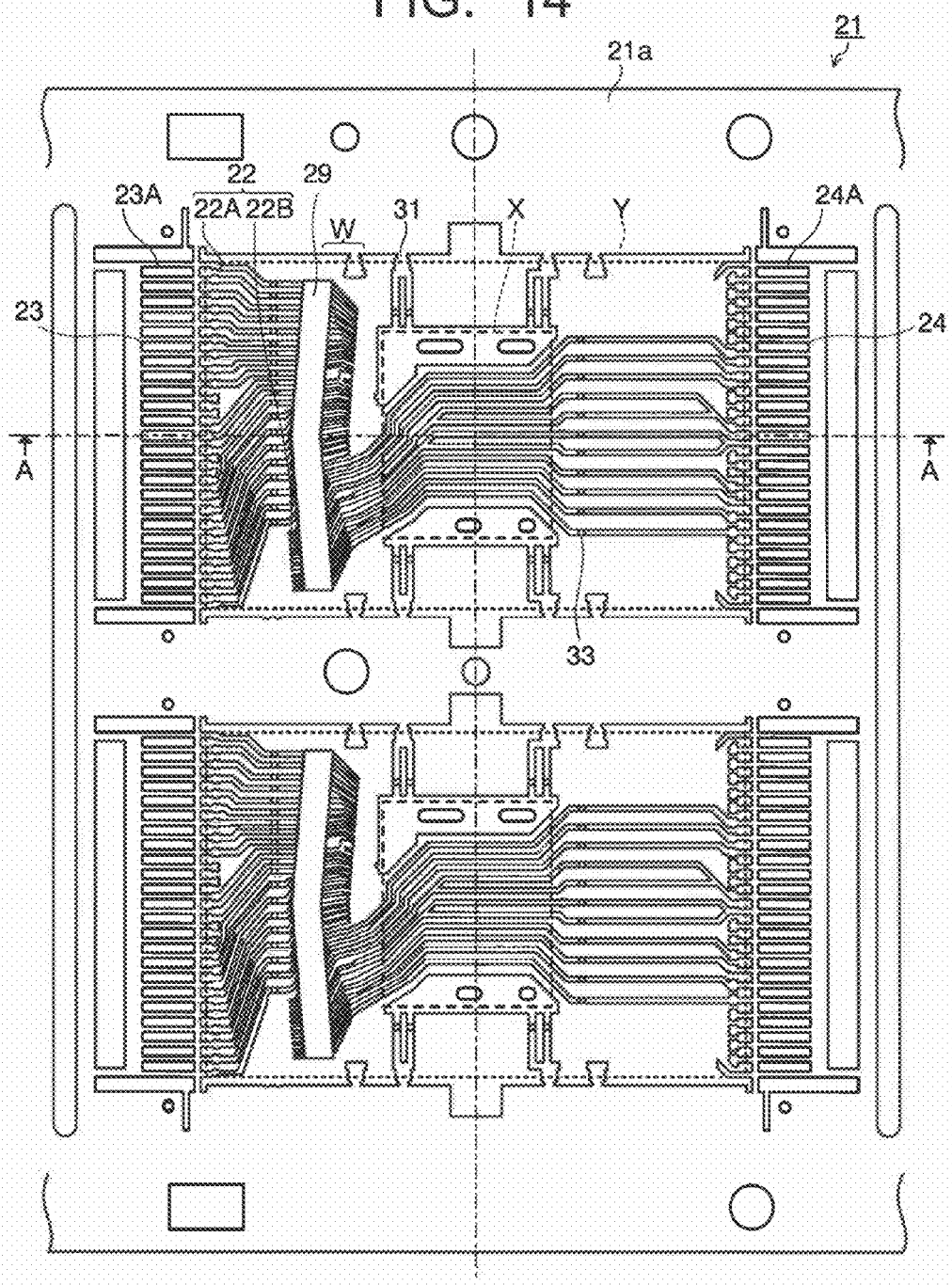
FIG. 14 is a plane view showing a state where inner leads of the lead frame shown in FIG. 12 are fixed by a fixing member.
Figure 15:
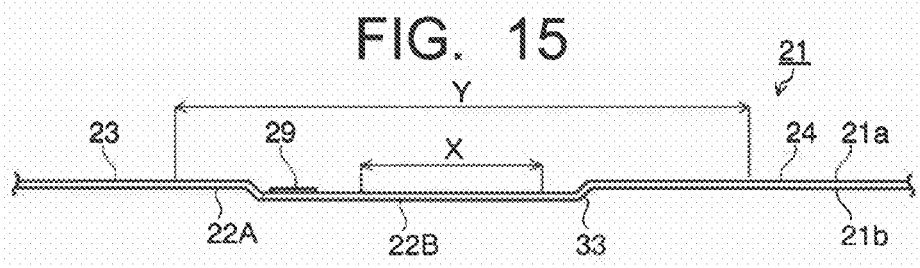
FIG. 15 is a cross-sectional view taken along A-A line in FIG. 14.

The semiconductor chip 25 has the single-side pad structure. Therefore, a connection area W for connection with the semiconductor chip 25 by the inner lead portion 22 is set along one side of the chip mounting area X. FIG. 12 and FIG. 14 show the lead frame 21 in which the connection area W for connection with the semiconductor chip 25 by the inner lead portion 22 is set on the first outer lead portion 23 side. The first inner leads 22A are disposed on the first outer lead portion 23 side, and therefore, while one-side ends thereof are connected to the first outer leads 23A, the other ends (leading ends) thereof can be disposed in the connection area W for connection with the semiconductor chip 25.

In the second inner leads 22B, while one-side ends are connected to the second outer leads 24A, the other ends (leading ends) need to be disposed in the connection area W on the first outer lead portion 23 side facing the second outer lead portion 24 across the chip mounting area X. For this purpose, the second inner leads 22B extend from the one-side ends connected to the second outer leads 24A to the other ends (leading ends) disposed in the connection area W set on the first outer lead portion 23 side. The second inner leads 22B are routed from the second outer lead portion 24 toward the first outer lead portion 23 via the chip mounting area X.

On the first surface 21a of the lead frame 21, the semiconductor chip 25 having the single-side pad structure is mounted. The semiconductor chip 25 has a rectangular outline and has electrode pads 26 arranged along one outline side. In order to enable wire bonding between the electrode pads 26 of the semiconductor chip 25 and the inner lead portion 22 (the leading ends of the first and second inner leads 22A, 22B), the semiconductor chip 25 is disposed so that the outline side along which the electrode pads 26 are arranged (pad arranged side) is located near the connection area W.

The electrode pads 26 of the semiconductor chip 25 are electrically connected to the leading ends of the first and second inner leads 22A, 22B of the inner lead portion 22 via metal wires 27 as shown in FIG. 16 and FIG. 17. Some of the electrode pads 26 are electrically connected via the metal wires 27 to the leading ends of the first inner leads 22A extending from the first outer leads 23A. Some others of electrode pads 26 are electrically connected via the metal wires 27 to the second inner leads 22B which are routed from the second outer leads 24A to the connection area W via the chip mounting area X.

Concrete examples of the semiconductor chip 25 include a semiconductor memory chip (memory device) such as a NAND flash memory. Though FIG. 16 and FIG. 17 show a state where the single semiconductor chip 25 is mounted on the lead frame 21, a plurality of semiconductor chips may be stacked and mounted on the lead frame 21. In this case, stacking the semiconductor chips having the single-side pad structure stepwise enables good wire bonding for each of the semiconductor chips. The number of the stacked semiconductor chips 25 is not particularly limited. The semiconductor chip 25 is not limited to the semiconductor memory chip. A stack of the semiconductor chips may have a semiconductor memory chip and its controller chip.

Since the second inner leads 22B are routed from the portions connected to the second outer leads 24A to the connection area W, it is necessary to fix the second inner leads 22B by a fixing member such as an adhesive tape, as in the first embodiment. The semiconductor chip 25 in the second embodiment is disposed nearer to the center of the lead frame 21, compared with that in the first embodiment. Therefore, the first inner leads 22A extend from the portions connected to the first outer leads 23A up to the connection area W. The first inner leads 22A in the second embodiment need to be fixed by a fixing member such as an adhesive tape similarly to the second inner leads 22B.

Figure 13:
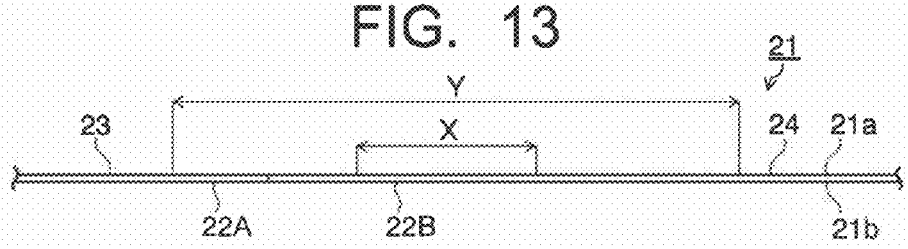
FIG. 13 is a cross-sectional view taken along A-A line in FIG. 12.

As shown in FIG. 12 and FIG. 13, in the lead frame 21 on a stage where it is punched out from a thin metal plate, the leading ends of the first and second inner leads 22A, 22B are coupled by coupling parts 28 respectively. The coupling parts 28 prevent the deformation of the inner leads 22A, 22B. Since the inner leads 22A, 22B cannot function in this state, the coupling parts 28 are cut. Before the coupling parts 28 are cut, the first and second inner leads 22A, 22B are fixed by the fixing member. However, when the first inner leads 22A and the second inner leads 22B are fixed separately, cost required for the fixing member is doubled.

Therefore, the lead frame 21 in the second embodiment includes a fixing member collectively fixing the first inner leads 22A and the second inner leads 22B. An adhesive tape 29 as the fixing member is affixed on surfaces, of the first and second inner leads 22A, 22B, to which the metal wires 27 are connected (bonding surfaces). The adhesive tape 29 is bonded from the first inner leads 22A to the second inner leads 22B. The coupling parts 28 provided at the leading ends of the first and second inner leads 22A, 22B are cut after the adhesive tape 29 is affixed.

The first inner leads 22A are routed outside the chip mounting area X. The leading ends of the first inner leads 22A are extended to the connection area W. The second inner leads 22B are routed inside the chip mounting area X. The leading ends of the second inner leads 22B are extended to an area beyond the connection area W. Portions of the second inner leads 22B beyond the connection area W overlap with portions of the first inner leads 22A not reaching the connection area. The adhesive tape 29 is bonded to the portions of the first inner leads 22A not reaching the connection area and the portions of the second inner leads 22B beyond the connection area W.

By fixing the first inner leads 22A and the second inner leads 22B by the single adhesive tape 29, it is possible to reduce cost required for the adhesive tape 29, compared with a case where the first inner leads 22A and the second inner leads 22B are fixed by different adhesive tapes. The adhesive tape 29 is affixed on the bonding surfaces of the first and second inner leads 22A, 22B. This enables good wire bonding to the first and second inner leads 22A, 22B held by the adhesive tape 29, without making any improvement or the like in a jig used for connecting the metal wires 27.

The fixing member (adhesive tape 29) collectively fixing the first inner leads 22A routed outside the chip mounting area X and the second inner leads 22B routed inside the chip mounting area X is not only used when the semiconductor chip 25 having the single-side pad structure is mounted on the lead frame 21. In a COL structure in which a semiconductor chip having electrode pads arranged along two sides is mounted on a lead frame, when some of inner leads are routed inside the chip mounting area, a similar fixing member can be employed. This can reduce three or more fixing members to two.

The semiconductor chip 25 mounted on the first surface 21a of the lead frame 21 is sealed by a resin sealing part 30 which is formed by molding as shown in FIG. 18 and FIG. 19. The semiconductor chip 25 mounted on the lead frame 21 is sealed by the resin sealing part 30 integrally with the inner lead portion 22 and the metal wires 27. As the resin sealing part 30, common epoxy resin is used. The resin sealing part 30 is provided so as to cover the first and second surfaces 21a, 21b of the lead frame 21.

As shown in FIG. 20 and FIG. 21, the first and second outer leads 23, 24, suspension pins 31, and so on are separated from the lead frame 21 and the first and second outer leads 23A, 24A are worked into a gull-wing shape, whereby a semiconductor device 32 using the lead frame 21 is formed. In the semiconductor device 32, the finally cut lead frame 21 forms a circuit base (lead member). The circuit base includes the inner lead portion 22, the outer lead portions 23, 24, and the chip mounting area X.

The resin sealing part 30 is formed so that the lead frame 21 is located near the center in terms of its thickness direction. On the first surface 21a of the lead frame 21, the semiconductor chip 25 is mounted. Therefore, in an area including the semiconductor chip 25, a thickness of a second surface 21b side of the resin sealing part 30 is larger than a thickness of a first surface 21a side thereof. The semiconductor chip 25 in the second embodiment has a smaller outline than the inner lead area Y.

As shown in FIG. 14 to FIG. 19, a portion of the lead frame 21 is worked into a depression. The lead frame 21 has a worked portion 33 formed in a manner that the periphery of the chip mounting area X and the connection area W is worked into the depression. The depression work is performed so that the chip mounting area X and the connection area W are formed in a concave shape. This can prevent warpage of the resin sealing part 30 due to an area with a large resin thickness difference. The portion worked into the depression preferably includes the area on which the adhesive tape 29 is affixed. Since this area is also an area with a large difference in resin thickness, the adhesive tape 29 is preferably affixed near the connection area W.

It should be noted that the present invention is not limited to the above-described embodiments and is applicable to semiconductor devices with various structures using a lead frame in which at least part of the chip mounting area X overlaps with the inner lead area Y. Such semiconductor devices are also included in the present invention. Further, the embodiments of the present invention can be expanded or modified within a range of the technical idea of the present invention, and the expanded or modified embodiments are also included in the technical scope of the present invention.

What is claimed is:

1. A semiconductor device, comprising:
a circuit base including:
   a chip mounting area,
   first outer leads,
   second outer leads opposed to the first outer leads via the chip mounting area,
   an electric connection area provided between the first outer leads and the chip mounting area,
   a fixing area, provided between the first outer leads and the electric connection area, having a first area and a second area,
   first inner leads, connected to the first outer leads, having leading ends extending to the electric connection area, and
   second inner leads, connected to the second outer leads and routed from the second outer leads toward the first outer leads via the chip mounting area, having leading ends extending to the second area of the fixing area;
a semiconductor chip, mounted on the chip mounting area of the circuit base, having electrode pads arranged along at least one outline side;
metal wires electrically connecting the electrode pads of the semiconductor chip and the first and second inner leads;
an adhesive tape affixed to portions of the first inner leads which are located in the first area of the fixing area and portions of the second inner leads which are located in the second area of the fixing area so as to fix collectively the first and second inner leads; and
a resin sealing part sealing the semiconductor chip together with the metal wires,
wherein the first inner leads have first depressed portions, and the second inner leads have second depressed portions.

2. The semiconductor device according to claim 1, wherein the first and second inner leads have surfaces to which the metal wires are connected, and the adhesive tape is affixed on the surfaces of the first and second inner leads.

3. The semiconductor device according to claim 1, wherein the semiconductor chip is disposed with the outline side being located near the electric connection area.

* * * * *